United States Patent
Sasaki (10) Patent No.: US 10,559,445 B2
(45) Date of Patent: Feb. 11, 2020

(54) PHOTOELECTRIC SURFACE, PHOTOELECTRIC CONVERSION TUBE, IMAGE INTENSIFIER, AND PHOTOMULTIPLIER TUBE

(71) Applicant: HAMAMATSU PHOTONICS K.K., Hamamatsu-shi, Shizuoka (JP)

(72) Inventor: Tatsuo Sasaki, Hamamatsu (JP)

(73) Assignee: HAMAMATSU PHOTONICS K.K., Hamamatsu-shi, Shizuoka (JP)

(*) Notice: Subject to any disclaimer, the term of this patent is extended or adjusted under 35 U.S.C. 154(b) by 0 days.

(21) Appl. No.: 15/538,693

(22) PCT Filed: Dec. 15, 2015

(86) PCT No.: PCT/JP2015/085037
§ 371 (c)(1),
(2) Date: Jun. 22, 2017

(87) PCT Pub. No.: WO2016/104243
PCT Pub. Date: Jun. 30, 2016

(65) Prior Publication Data
US 2018/0025881 A1    Jan. 25, 2018

(30) Foreign Application Priority Data

Dec. 26, 2014 (JP) .................. 2014-264384

(51) Int. Cl.
*H01J 1/34* (2006.01)
*H01J 1/78* (2006.01)
(Continued)

(52) U.S. Cl.
CPC ............. *H01J 1/34* (2013.01); *H01J 29/38* (2013.01); *H01J 31/506* (2013.01);
(Continued)

(58) Field of Classification Search
CPC ...... H01J 1/34; H01J 1/78; H01J 29/38; H01J 29/385; H01J 31/49; H01J 31/50;
(Continued)

(56) References Cited

U.S. PATENT DOCUMENTS

2002/0089283 A1* 7/2002 Francke ............. G08B 17/12
313/539
2004/0180266 A1* 9/2004 Hirao ................ G03H 1/02
430/1
(Continued)

FOREIGN PATENT DOCUMENTS

CN    1794399    6/2006
CN    101379582    3/2009
(Continued)

OTHER PUBLICATIONS

International Preliminary Report on Patentability dated Jul. 6, 2017 for PCT/JP2015/085037.

*Primary Examiner* — Zandra V Smith
*Assistant Examiner* — Jeremy J Joy
(74) *Attorney, Agent, or Firm* — Drinker Biddle & Reath LLP (57) ABSTRACT

The present invention improves sensitivity of the ultraviolet band of a photoelectric surface. A photoelectric surface includes a window material that transmits ultraviolet rays, a conductive film that is formed on the window material and has conductivity, an intermediate film 4 that is formed on the conductive film and is formed of $MgF_2$, and a photoelectric conversion film that is formed on the intermediate film 4 and is formed of CsTe. Since the photoelectric surface includes the intermediate film 4 formed of $MgF_2$, the sensitivity of the ultraviolet band is improved.

8 Claims, 9 Drawing Sheets

(51) Int. Cl.
*H01J 29/38* (2006.01)
*H01J 31/49* (2006.01)
*H01J 31/50* (2006.01)
*H01J 40/06* (2006.01)
*H01J 40/16* (2006.01)
*H01L 31/0272* (2006.01)
*H01L 31/0392* (2006.01)

(52) U.S. Cl.
CPC .... *H01L 31/0272* (2013.01); *H01L 31/03925* (2013.01); *H01J 31/49* (2013.01); *H01J 2201/3423* (2013.01); *H01J 2201/3426* (2013.01); *H01J 2231/50021* (2013.01)

(58) Field of Classification Search
CPC .......... H01J 31/506; H01J 40/06; H01J 40/16; H01J 2201/3426; H01J 2201/3423; H01J 2231/50021; H01L 31/0272; H01L 31/03925
See application file for complete search history.

(56) References Cited

U.S. PATENT DOCUMENTS

| | | | |
|---|---|---|---|
| 2007/0235717 A1* | 10/2007 | Heo | H01J 1/35 257/21 |
| 2009/0127642 A1* | 5/2009 | Yamashita | H01J 1/34 257/431 |
| 2009/0273281 A1* | 11/2009 | Niigaki | H01J 1/34 313/542 |
| 2011/0089825 A1* | 4/2011 | Matsui | H01J 1/34 313/542 |
| 2012/0012811 A1* | 1/2012 | DeFlumere | G02B 5/122 257/10 |
| 2014/0167198 A1* | 6/2014 | Hoenk | H01L 31/02161 257/437 |
| 2016/0163492 A1* | 6/2016 | Breuil | G08B 17/12 250/370.01 |

FOREIGN PATENT DOCUMENTS

| | | | |
|---|---|---|---|
| JP | 04275463 A | * | 10/1992 |
| JP | H04-275463 A | | 10/1992 |
| JP | H06-068840 A | | 3/1994 |
| JP | H7-016016 | | 2/1995 |
| JP | H07-160016 A | | 6/1995 |
| JP | 2003-203581 A | | 7/2003 |
| JP | 2003203581 A | * | 7/2003 |
| JP | 2003203581 A | * | 7/2003 |
| JP | 2006-179467 A | | 7/2006 |
| JP | 2007-242412 A | | 9/2007 |
| JP | 4116294 B2 | | 7/2008 |
| JP | 2010-286316 | | 12/2010 |
| WO | WO 2014/097963 | | 6/2014 |

* cited by examiner

PHOTOELECTRIC SURFACE, PHOTOELECTRIC CONVERSION TUBE, IMAGE INTENSIFIER, AND PHOTOMULTIPLIER TUBE

TECHNICAL FIELD

The present invention relates to a photoelectric surface, a photoelectric conversion tube having the photoelectric surface, an image intensifier, and a photomultiplier tube.

BACKGROUND ART

Patent Literatures 1, 2 and 3 disclose photoelectric surfaces having a laminated structure. The photoelectric surface disclosed in Patent Literature 1 has a laminated structure in which a substrate, a base film, an intermediate film, and a photoelectric conversion film are laminated in this order. The photoelectric surfaces disclosed in Patent Literatures 2 and 3 each have a laminated structure in which a window material, a base film, and a photoelectron emitting film are laminated in this order.

CITATION LIST

Patent Literature

[Patent Literature 1] Japanese Examined Patent Publication No. H7-16016
[Patent Literature 2] Japanese Unexamined Patent Publication No. H6-68840
[Patent Literature 3] Japanese Patent No. 4116294

SUMMARY OF INVENTION

Technical Problem

The photoelectric surfaces described in Patent Literatures 1, 2 and 3 are used for detection of flames. A flame has a particular spectrum in a wavelength range of 300 nm or less. On the other hand, the sunlight reached the ground has a very narrow spectrum in an ultraviolet band of 300 nm or less due to absorption of an ozone layer. The band in which the spectrum of the sunlight becomes very narrow is also referred to as a solar blind band. In the solar blind band, as long as the photoelectric surface exhibits good sensitivity, it is possible to expect good light detection properties in which the effect of the sunlight is suppressed.

In the technical field, it is desired to improve the sensitivity of the photoelectric surface in an ultraviolet band.

Solution to Problem

According to a first aspect of the present invention, there is provided a photoelectric surface having a laminated structure including: a window material that transmits ultraviolet rays, a conductive film that is formed on the window material and has conductivity, an intermediate film that is formed on the conductive film and includes a compound of magnesium and fluorine, and a photoelectric conversion film that is formed on the intermediate film and includes tellurium and an alkali metal.

Since the photoelectric conversion film of the photoelectric surface includes tellurium and an alkali metal, a wavelength band detected by the photoelectric surface can be set to an ultraviolet band including a solar blind band. In addition, the intermediate film including a compound of magnesium and fluorine is formed between the photoelectric conversion film and the conductive film. Since the intermediate film including a compound of magnesium and fluorine has a relatively large band gap, a film having a large band gap is disposed on the surface of the photoelectric conversion film on the side of the window material. Then, the curvature of the band occurs and the photoelectron extraction efficiency is improved. Thus, according to the photoelectric surface, it is possible to improve the sensitivity in an ultraviolet band.

The compound may be magnesium fluoride and the alkali metal may be cesium. According to the constitutions thereof, since lattice mismatch generated between the photoelectric conversion film and the intermediate film is likely to be suppressed, it is possible to suppress a decrease in the crystallinity of the photoelectric conversion film. Accordingly, it is possible to further improve the sensitivity.

In addition, the conductive film may include titanium. According to the constitution, the photoelectrons generated in the photoelectric conversion film can be efficiently extracted.

The window material may include quartz. According to the constitution, since the attenuation of light occurring when the light passes through the window material is suppressed, it is possible to further improve the sensitivity.

According to another aspect of the present invention, there is provided a photoelectric conversion tube including: a vacuum container that includes the photoelectric surface. Since the photoelectric conversion tube includes the photoelectric surface, it is possible to improve the sensitivity in an ultraviolet band.

According to still another aspect of the present invention, there is provided an image intensifier including: a vacuum container that includes the photoelectric surface, electron multiplier means that is accommodated in the vacuum container and multiplies electrons emitted from the photoelectric conversion film, and a fluorescent surface onto which the electrons multiplied by the electron multiplier means are made incident and that converts the electrons multiplied by the electron multiplier means into light. Since the image intensifier includes the photoelectric surface, it is possible to improve the sensitivity in an ultraviolet band.

According to still another aspect of the present invention, there is provided a photomultiplier tube including: a vacuum container that includes the photoelectric surface, electron multiplier means that is accommodated in the vacuum container and multiplies electrons emitted from the photoelectric conversion film, and an anode that is accommodated in the vacuum container and onto which the electrons multiplied by the electron multiplier means are made incident. Since the photomultiplier tube includes the photoelectric surface, it is possible to improve the sensitivity in an ultraviolet band.

Advantageous Effects of Invention

According to the photoelectric surface according to one aspect, and the photoelectric conversion tube, the image intensifier, and the photomultiplier tube according to another aspects of the present invention, it is possible to improve sensitivity in an ultraviolet band.

DESCRIPTION OF EMBODIMENTS

Hereinafter, embodiments for carrying out the present invention will be described in detail with reference to the attached drawings. The same elements are denoted with the same reference symbols in descriptions of the drawings, and overlapping description will thus be omitted.

Figure 1:
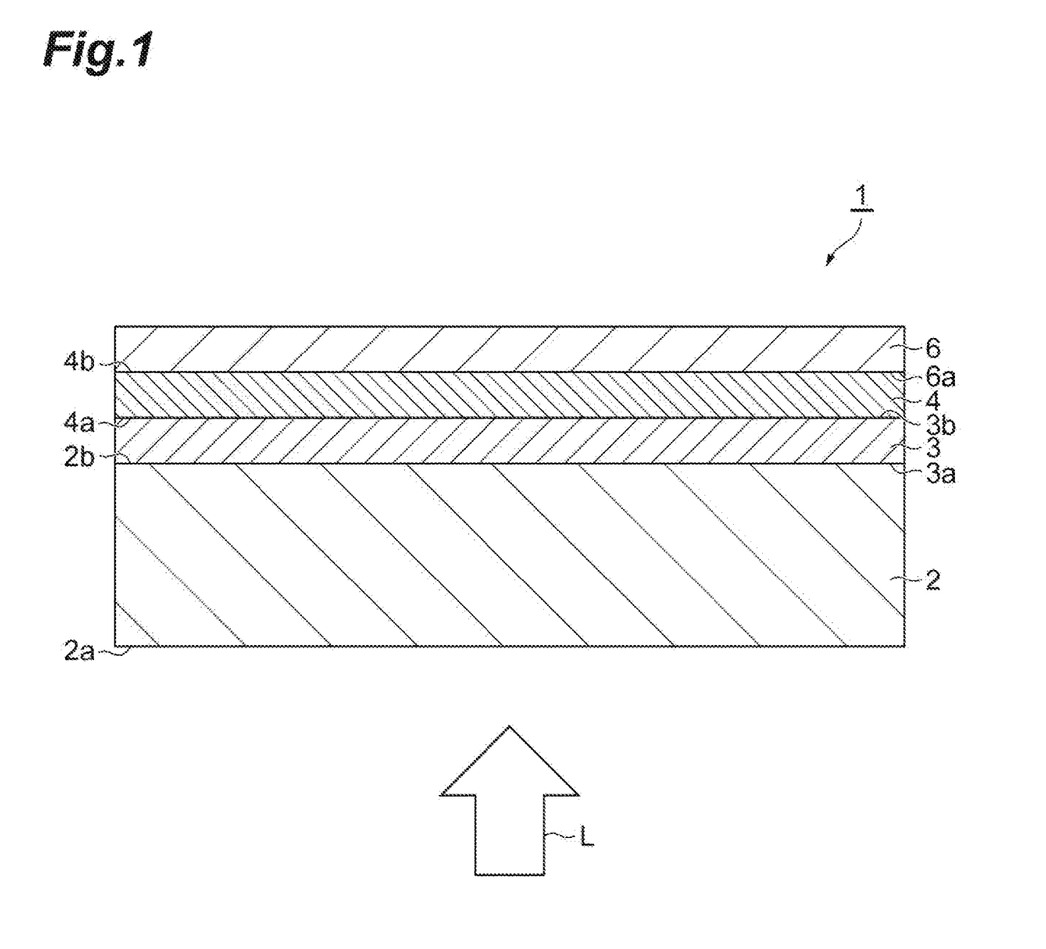
FIG. 1 is a view showing a cross section of a photoelectric surface according to an embodiment of the present invention.
Figure 2:
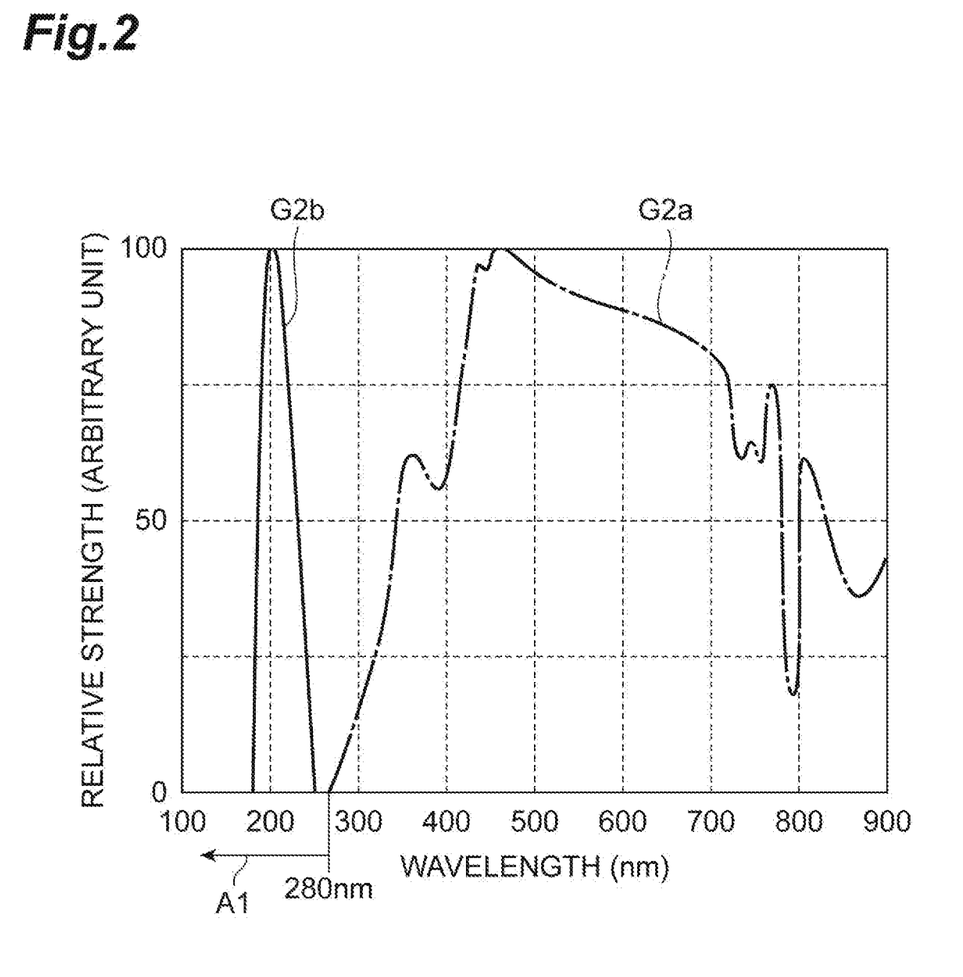
FIG. 2 is a graph showing a relationship between a spectrum of sunlight and a spectrum of a detection band of the photoelectric surface.

A photoelectric surface 1 shown in FIG. 1 detects light L in an ultraviolet band. The wavelength band of the light L detected by the photoelectric surface 1 (hereinafter, also referred to as a "detection band") is set to a wavelength band included in an ultraviolet band. Specifically, the detection band may be set to a wavelength of 200 nm or more and 350 nm or less included in a near ultraviolet band and may be further set to a wavelength of 260 nm or more and 300 nm or less. In addition, the detection band may be set to a band having a wavelength of 280 nm as the center. Particularly, the spectrum of the sunlight is very small in the band having a wavelength of 280 nm or less, so-called solar blind band. As shown in FIG. 2, the spectrum of the sunlight (refer to graph G2a) is very narrow in the range in which the wavelength is about 280 nm or less (refer to band A1). Accordingly, in the case in which the detection band (refer to graph G2b) is set to a wavelength of 280 nm or less, the photoelectric surface 1 can be used for engine flare analysis or the like under the environment of sunlight.

As shown in FIG. 1, the photoelectric surface 1 has a laminated structure. The photoelectric surface 1 includes a window material 2, a conductive film 3, an intermediate film 4, and a photoelectric conversion film 6, and these films are laminated in this order. Accordingly, the light L incident to the window material 2 passes through the window material 2, the conductive film 3, and the intermediate film 4, and then reaches the photoelectric conversion film 6.

The window material 2 is a substrate of the photoelectric surface 1. The window material 2 has an incident surface 2a onto which the light L is made incident, and a rear surface 2b on the opposite side of the incident surface 2a. The window material 2 has good transmission with respect to light in the detection band of the photoelectric surface 1. Accordingly, the window material 2 is made of a material that allows transmittance of ultraviolet rays. As the material that allows transmittance of ultraviolet rays, quartz ($SiO_2$) may be used.

The conductive film 3 is formed on a rear surface 2b of the window material 2. The conductive film 3 has a front surface 3a which comes in contact with the window material 2 and a rear surface 3b on the opposite side of the front surface 3a. The conductive film 3 is a base film of the photoelectric conversion film 6 with respect to the window material 2. In addition, the conductive film 3 transmits the light L incident to the window material 2 and supplies photoelectrons to be emitted in the photoelectric conversion film 6. As a material for forming the conductive film 3, for example, a metallic material having conductivity such as titanium (Ti) may be used. In the case in which the conductive film 3 is formed of Ti, the film thickness may be 2 nm or more and 10 min or less. In other words, the film thickness may be 20 Å or more and 100 Å or less. In addition, the film thickness may be 0.1 nm or more and 2 nm or less. In other words, the film thickness may be 1 Å or more and 20 Å or less.

The intermediate film 4 is formed on the rear surface 3b of the conductive film 3. The intermediate film 4 has a surface 4a which comes in contact with the conductive film 3 and an interface 4b on the opposite side of the surface 4a. The intermediate film 4 is a base film of the photoelectric conversion film 6 with respect to the conductive film 3. In addition, the intermediate film 4 transmits the light L incident to the window material 2 and forms a region having a high band gap on the side of a surface 6a of the photoelectric conversion film 6. The intermediate film 4 is formed of magnesium fluoride ($MgF_2$) which is a compound of magnesium (Mg) and fluorine (F). The band gap of $MgF_2$ is 11.4 eV. In addition, the film thickness of the intermediate film 4 is 0.5 nm or more and 5 nm or less). In order words, the film thickness of the intermediate film 4 is 5 Å or more and 50 Å or less. For example, in the case in which the detection band of the photoelectric surface 1 is set to a band having a wavelength of 280 nm as the center, the film thickness of the intermediate film 4 may be set to 0.5 nm or more and 5 nm or less. In other words, the film thickness of the intermediate film 4 may be set to 5 Å or more and 50 Å or less. The intermediate film 4 is formed by deposition or sputtering.

The photoelectric conversion film 6 is formed at the interface 4b of the intermediate film 4. The photoelectric conversion film 6 has the surface 6a which comes into contact with the intermediate film 4. The photoelectric conversion film 6 produces photoelectrons by the incident light L. The photoelectric conversion film 6 is formed of a compound of tellurium (Te) and an alkali metal such as cesium-tellurium (CsTe).

Since the photoelectric conversion film 6 of the photoelectric surface 1 is formed of CsTe, the detection wavelength can be set to an ultraviolet band including a solar blind band. In addition, the intermediate film 4 formed of $MgF_2$ is formed between the photoelectric conversion film 6 and the conductive film 3. Since the intermediate film 4 has a relatively large band gap, a film having a large band gap is disposed on the surface of the photoelectric conversion film 6 on the side of the window material 2. Then, the curvature of the band occurs, and the photoelectron extraction efficiency is improved. Thus, according to the photoelectric surface 1, it is possible to improve the sensitivity in an ultraviolet band.

In the photoelectric surface 1, the intermediate film 4 is formed of $MgF_2$, and the photoelectric conversion film 6 is formed of CsTe. According to the constitution, it is possible to suppress a decrease in the crystallinity of the photoelectric conversion film 6 by suppressing lattice mismatch generated between the photoelectric conversion film 6 and the intermediate film 4. Accordingly, it is possible to further improve the sensitivity of the photoelectric surface 1.

Further, the conductive film 3 is formed of titanium. According to the constitution, photoelectrons generated in the photoelectric conversion film 6 can be efficiently extracted.

The window material 2 is formed of quartz. According to the constitution, since the attenuation of the light L occurring when the light passes through the window material 2 is suppressed, it is possible to further improve the sensitivity of the photoelectric surface 1.

Figure 3:
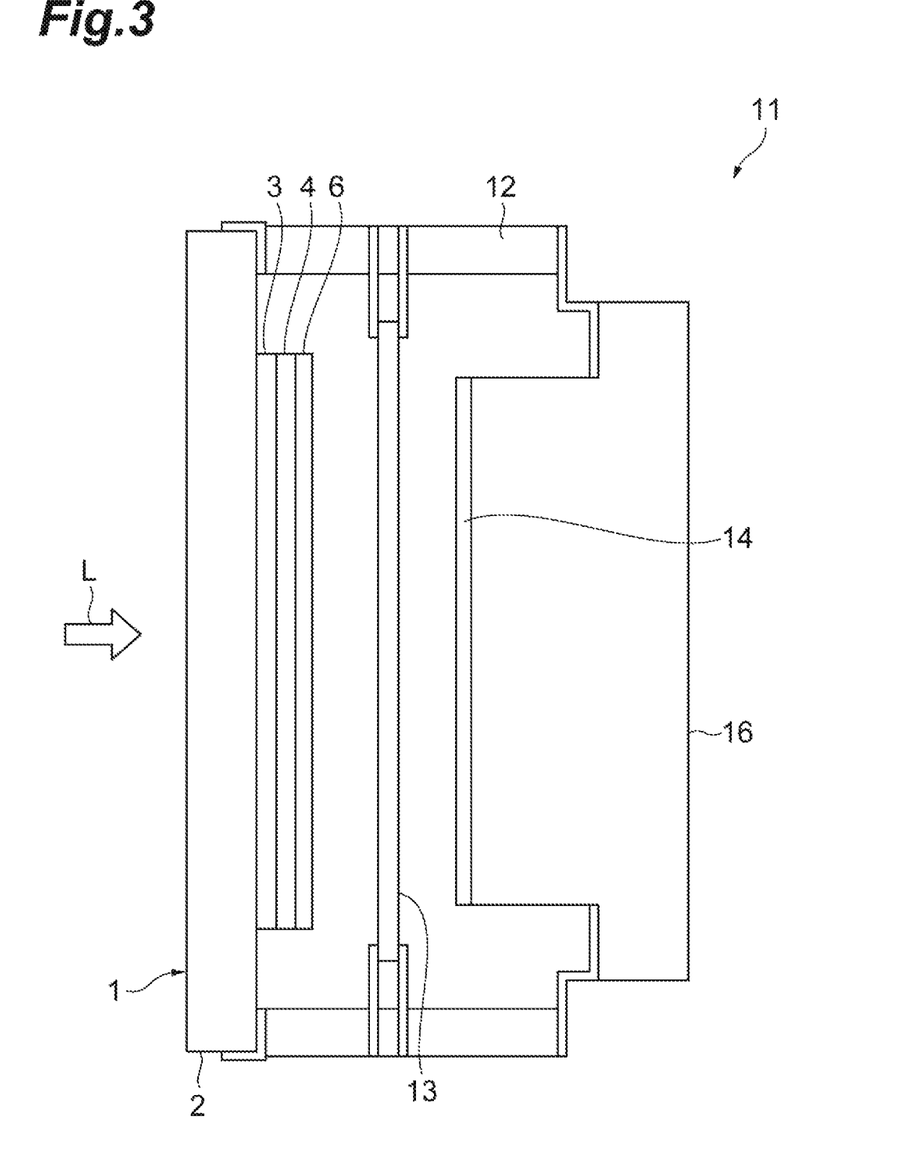
FIG. 3 is a view showing a structure of an image intensifier having the photoelectric surface.

The above-described photoelectric surface 1 is used for an image intensifier 11 shown in FIG. 3. FIG. 3 shows a structure of the image intensifier 11 including the photoelectric surface 1. As shown in FIG. 3, the short-range image intensifier 11 includes the photoelectric surface 1, a vacuum container 12, a microchannel plate 13, a fluorescent surface 14, and an emission window material 16. The photoelectric surface 1 is provided on one end side of the vacuum container 12. In addition, in the vacuum container 12, the microchannel plate 13, which is electron multiplier means, is provided behind the photoelectric surface 1. The fluorescent surface 14 is provided further behind the microchannel plate 13. The electrons multiplied by the microchannel plate 13 are incident to the fluorescent surface 14. In the fluorescent surface 14, the incident electrons are converted into light. The converted light is emitted to the outside through the emission window material 16.

Since the image intensifier 11 includes the above-described photoelectric surface 1, it is possible to improve the sensitivity in an ultraviolet band.

EXAMPLE 1

In Example 1, the sensitivity of the photoelectric surface 1 was confirmed. For the sensitivity of the photoelectric surface 1, quantum efficiency was adopted. The quantum efficiency is a ratio of the number of photoelectrons with respect to the number of photons incident to the photoelectric surface 1. The quantum efficiency is measured by, for example, a spectral sensitivity measurement device. The spectral sensitivity measurement device has a light source, a spectroscope which monochromates measurement target light, and a set standard light detector (for example, silicon photodiode). The photoelectric surface 1 according to Example 1 has the following constitution. In Example 1, a plurality of photoelectric surfaces 1 having the following constitution were prepared and the quantum efficiency of each of the photoelectric surfaces 1 was measured.

Window material: quartz (film thickness: 5.94 mm)
Conductive film: Ti (film thickness: 0.5 nm)
Intermediate film: $MgF_2$ (film thickness: 5 nm)
Photoelectric conversion film: CsTe (film thickness: 10 nm)

Figure 4:
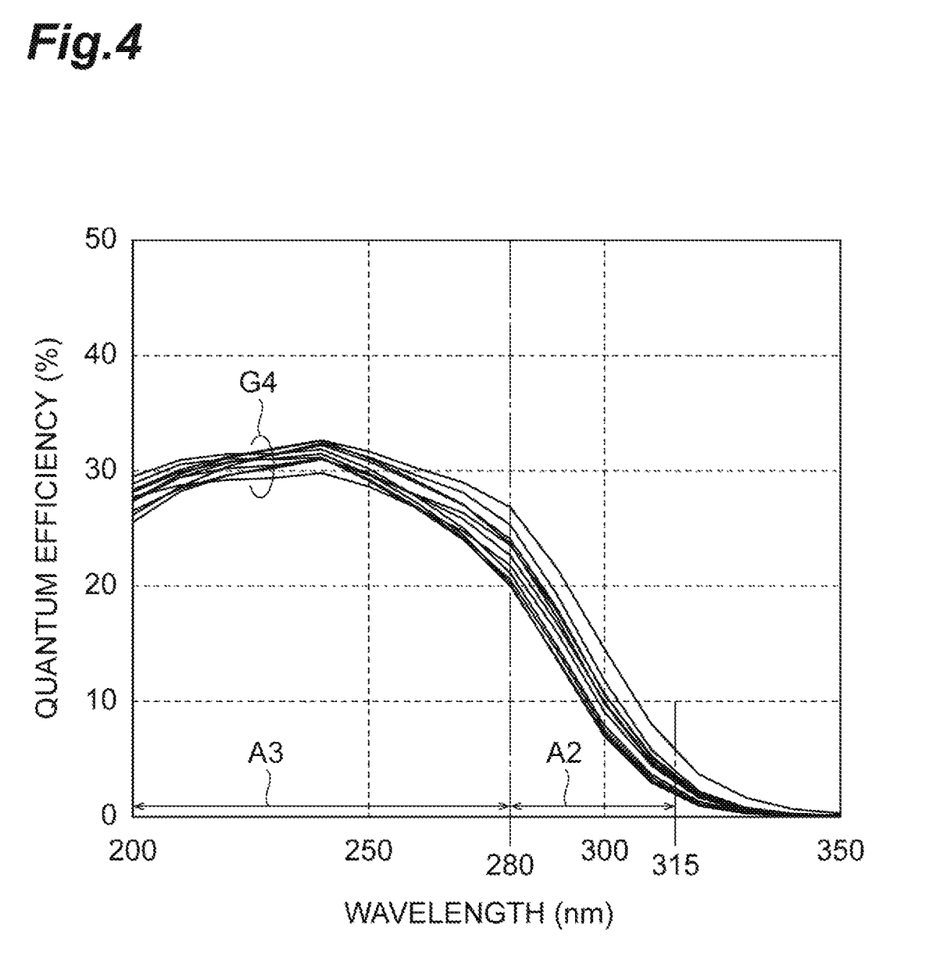
FIG. 4 is a graph showing a relationship between the detection wavelength and the quantum efficiency of each photoelectric surface according to Example 1.

FIG. 4 shows a relationship between the detection wavelength and the quantum efficiency of each photoelectric surface 1. The horizontal axis represents the wavelength and the vertical axis represents the quantum efficiency. A plurality of graphs G4 show the quantum efficiency of each photoelectric surface 1. As shown in FIG. 4, it could be confirmed that each photoelectric surface 1 had a quantum efficiency of about from 2% to 26% in a band A2 ranging from 280 nm to 315 nm. In addition, it could be confirmed that photoelectric surface 1 had a quantum efficiency of about from 20% to 32% in a band A3 ranging from 200 nm to 280 nm. Further, it could be confirmed that photoelectric surface had a quantum efficiency of about from 20% to 26% at a wavelength of 280 nm.

EXAMPLE 2

In Example 2, the effect of the film thickness of the intermediate film 4 on the quantum efficiency was confirmed. Specifically, a plurality of photoelectric surfaces 1 having intermediate films 4 with only different thicknesses were prepared and the quantum efficiency of the respective photoelectric surfaces 1 was measured. The photoelectric surface 1 according to Example 2 has the following constitution.

Window material: quartz (film thickness: 5.94 mm)
Conductive film: Ti (film thickness: 0.5 nm)
Intermediate film: $MgF_2$ (film thickness: 50 nm, 10 nm, 5 nm, in other words, film thickness: 500 Å, 100 Å, 50 Å)
Photoelectric conversion film: CsTe (film thickness: 10 nm)

Figure 5:
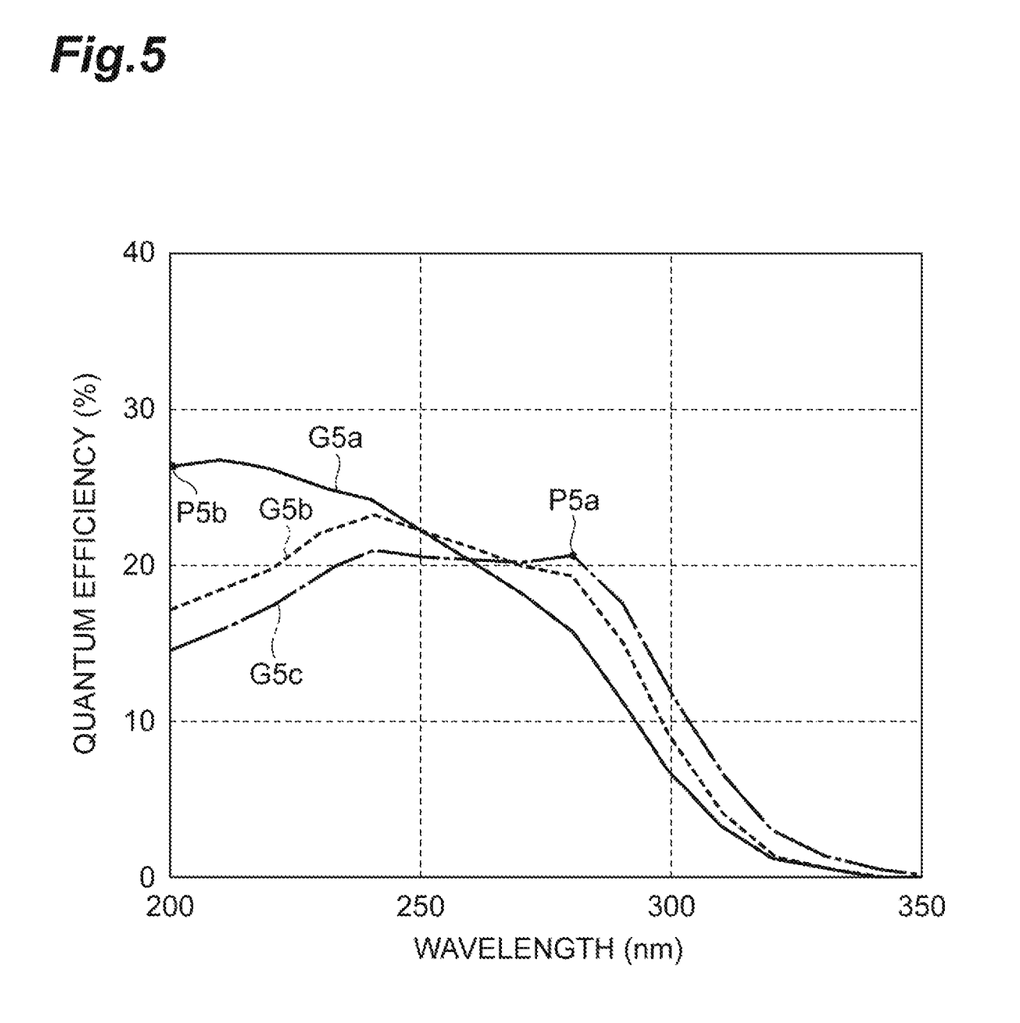
FIG. 5 is a graph showing a relationship between the transmittance of a conductive film and quantum efficiency according to Example 2.

The graph G5a in FIG. 5 shows the quantum efficiency of the photoelectric surface 1 in which the film thickness of the intermediate film 4 is 50 nm. The graph G5b shows the quantum efficiency of the photoelectric surface 1 in which the film thickness of the intermediate film 4 is 10 nm. The graph G5c shows the quantum efficiency of the photoelectric surface 1 in which the film thickness of the intermediate film 4 is 5 nm. According to graphs G5a, G5b, and G5c, it was found that in a wavelength band ranging from 200 nm to 280 nm, the magnitude relation of the quantum efficiency changed according to the film thickness of the intermediate film 4. From the result, it was found that in the case in which the detection band of the photoelectric surface 1 was set to a wavelength near 280 nm, it was preferable that the film thickness of the intermediate film 4 was made thin (refer to plot P5a). The thin film thickness is, for example, 5 nm. In other words, the thin film thickness is, for example, 50 Å. On the other hand, it was found that in the case in which the detection band of the photoelectric surface 1 was set to a wavelength near 200 nm, it was preferable that the film thickness of the intermediate film 4 was made thick (refer to plot P5b). The thick film thickness is, for example, 50 nm. In other words, the thick film thickness is, for example, 500 Å.

EXAMPLE 3

In Example 3, the effect of the constitution of the conductive film 3 on the quantum efficiency was confirmed. Specifically, a plurality of photoelectric surfaces 1 having conductive films 3 of different materials or structures from each other were prepared and the quantum efficiency of the respective photoelectric surfaces 1 was measured. The photoelectric surface 1 according to Example 3 has the following constitution.

Window material: quartz (film thickness: 5.94 mm)
Conductive film: Ti (film thickness: 0.5 nm), Ti (film thickness: 2.5 nm), carbon nanotube (film thickness: 1 nm), graphene (film thickness: 0.335 nm), stripe electrode (film thickness: 2.5 nm)
Intermediate film: $MgF_2$ (film thickness: 5 nm)
Photoelectric conversion film: CsTe (film thickness: 10 nm)

Figure 6:
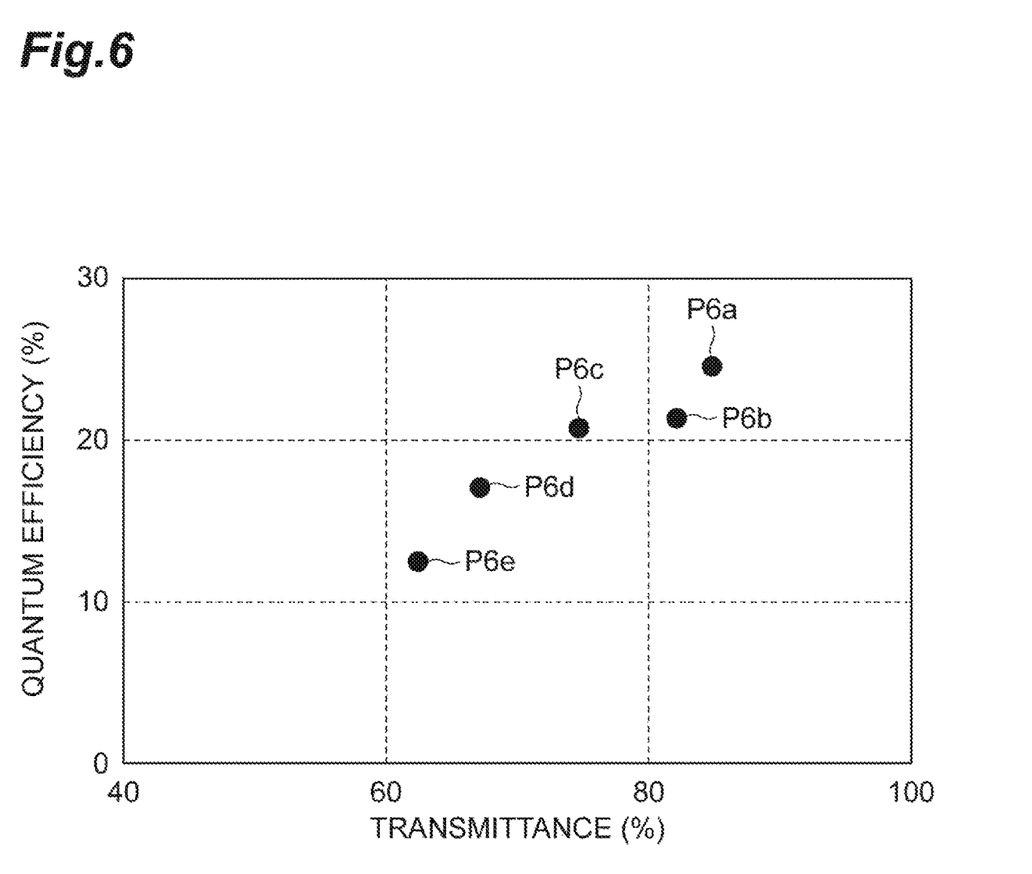
FIG. 6 is a graph showing a relationship between the transmittance of a conductive film and quantum efficiency according to Example 3.

FIG. 6 shows the quantum efficiency of each photoelectric surface 1 with respect to a wavelength of 280 nm. The vertical axis represents the quantum efficiency of the photoelectric surface 1. The horizontal axis represents the transmittance of the conductive film 3. The transmittance represented by the horizontal axis in FIG. 6 is an actually measured transmittance of each of test pieces in which various conductive films are formed on the window material 2 formed of a quartz surface plate. The transmittance is measured by a spectrophotometer or by transmittance measurement using a spectrophotometer including a light source, a spectroscope, and a light detector. In FIG. 6, the plot P6a shows the quantum conversion efficiency in the case in which the conductive film 3 is formed of graphene. The plot P6b shows the quantum conversion efficiency in the case in which the conductive film 3 has a stripe electrode structure. The plot P6c shows the quantum conversion efficiency in the case in which the conductive film 3 is formed of Ti (film thickness: 0.5 nm). The plot P6d shows the quantum conversion efficiency in the case in which the conductive film 3 is formed of Ti (film thickness: 2.5 nm). The plot P6e shows the quantum conversion efficiency in the case in which the conductive film 3 is formed of a carbon nanotube. As shown by plots P6a, P6b, P6c, P6d, and P6e, it was found that as the transmittance of the conductive film 3 increased, the quantum efficiency increased. Particularly, in the case in which the conductive film 3 was graphene, a stripe electrode, or Ti having a film thickness of 0.5 nm, a quantum efficiency of 20% or more could be obtained at a wavelength of 280 nm.

COMPARATIVE EXAMPLE 1

In Comparative Example 1, the effect of the constitutional material of the intermediate film 4 on the quantum efficiency was confirmed. Specifically, photoelectric surfaces having an intermediate film including an oxide were prepared and the quantum efficiency of each of the photoelectric surfaces was measured. The photoelectric surface according to Comparative Example 1 has the following constitution.

Window material: quartz (film thickness: 5.94 mm)
Conductive film: Ti (film thickness: 2.5 nm), Pt (film thickness: 2.5 nm)
Intermediate film: two-layer structure (first layer: $Al_2O_3$, second layer: ZnO), $Al_2O_3$ with a conductive film formed of Ti, $TiO_2$, $Al_2O_3$ with a conductive film formed of Pt
Photoelectric conversion film: CsTe (film thickness: 10 nm)

Figure 7:
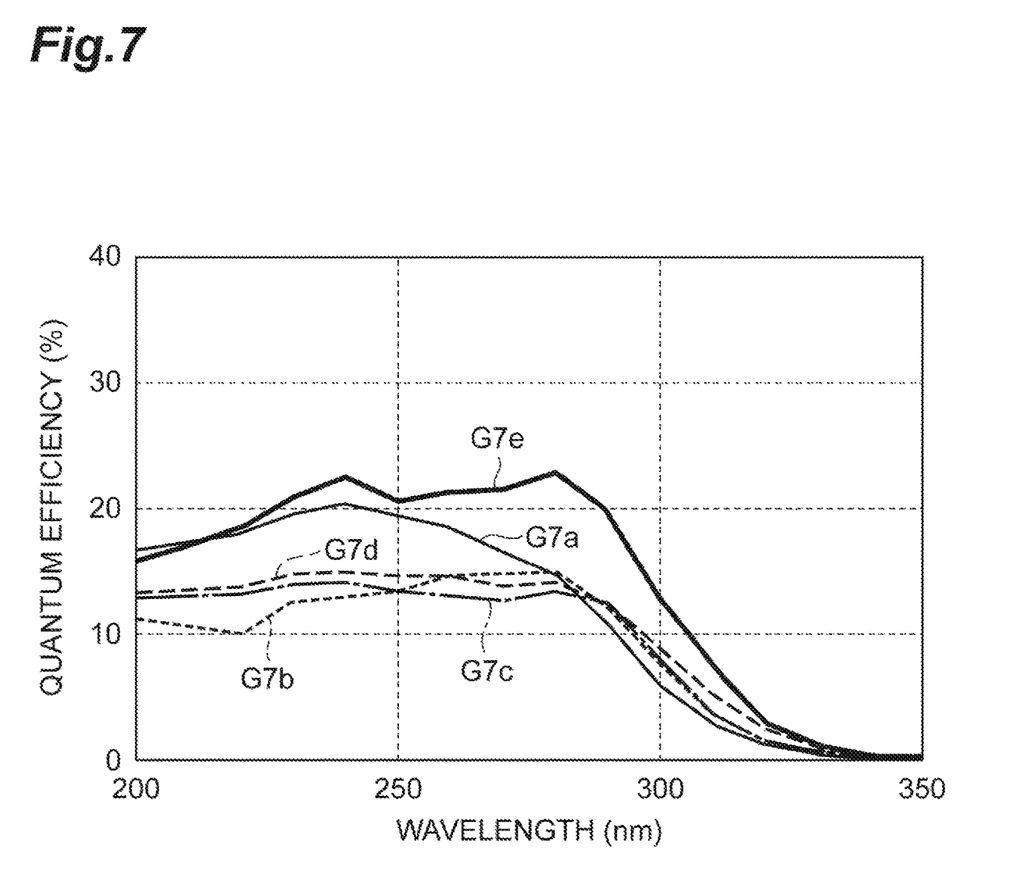
FIG. 7 is a graph showing a relationship between the detection wavelength and the quantum efficiency of each photoelectric surface according to Comparative Example 1.

FIG. 7 is a graph comparing the quantum efficiency of the photoelectric surface in Comparative Example 1 and the quantum efficiency of the photoelectric surface 1. The graph G7a shows the quantum efficiency of a photoelectric surface having an intermediate film having a two-layer structure. The intermediate film has a first layer formed of $Al_2O_3$ and a second layer formed of ZnO. The graph G7b shows the quantum efficiency of a photoelectric surface having a conductive film formed of Ti and an intermediate film formed of $Al_2O_3$. The graph G7c shows the quantum efficiency of a photoelectric surface having a conductive film formed of Pt and an intermediate film formed of $TiO_2$. The graph G7d shows the quantum efficiency of a photoelectric surface having a conductive film formed of Pt and an intermediate film formed of $Al_2O_3$. The graph G7e shows the quantum efficiency of the photoelectric surface 1 having an intermediate film 4 formed of $MgF_2$. As shown in FIG. 7, it was found that the graph G7e showed the highest quantum efficiency in a band of 200 nm or more and 350 nm or less. Accordingly, it was found that as the material forming the intermediate film 4, a fluoride was more preferable than an oxide.

COMPARATIVE EXAMPLE 2

In Comparative Example 2, the effect of the material forming the intermediate film 4 on the quantum efficiency was confirmed. Specifically, photoelectric surfaces having intermediate films formed of fluorides different from $MgF_2$ were prepared and the quantum efficiency of each of the photoelectric surfaces was measured. As fluorides different from $MgF_2$, lithium fluoride (LiF) and calcium fluoride ($CaF_2$) were used. The photoelectric surface according to Comparative Example 2 has the following constitution.

Window material: quartz (film thickness: 5.94 mm)
Conductive film: Ti (film thickness: 2.5 nm)
Intermediate film: LiF (film thickness: 5 nm), $CaF_2$ (film thickness: 5 nm)
Photoelectric conversion film: CsTe (film thickness: 10 nm)

Figure 8:
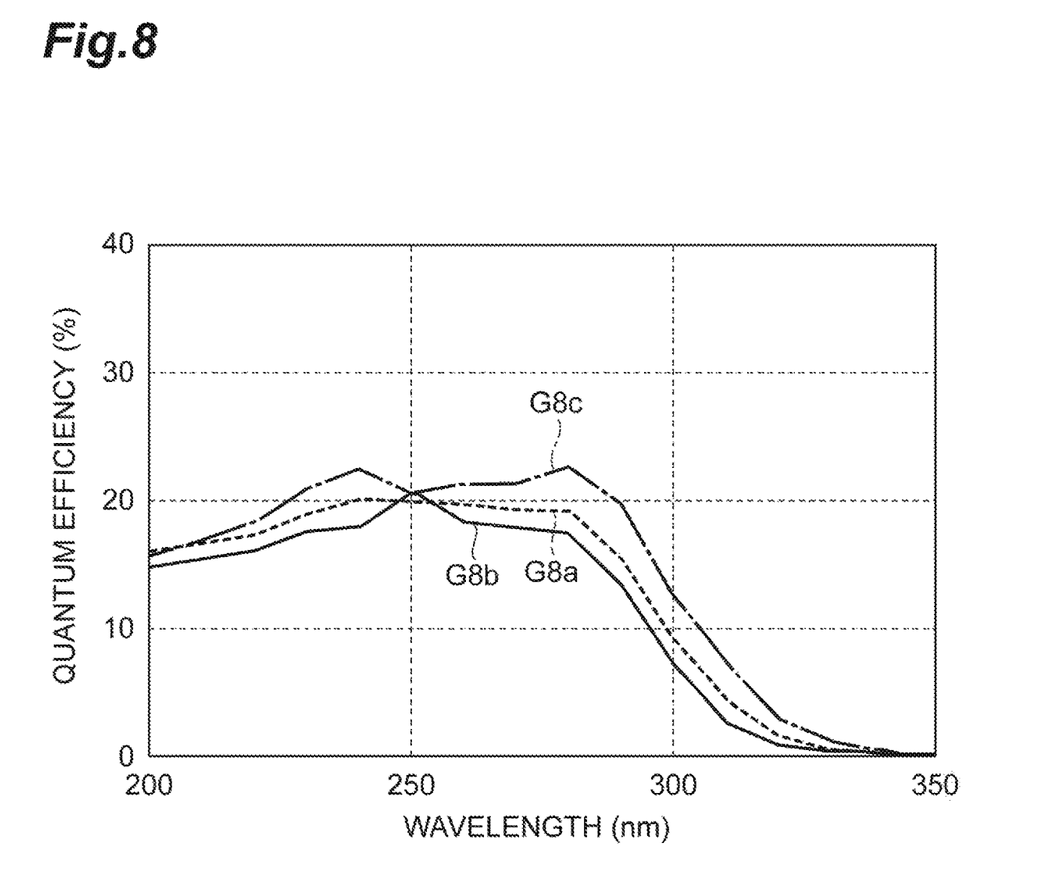
FIG. 8 is a graph showing a relationship between the detection wavelength and the quantum efficiency of each photoelectric surface according to Comparative Example 2.

FIG. 8 is a graph comparing the quantum efficiency of the photoelectric surface in Comparative Example 2 and the quantum efficiency of the photoelectric surface 1. The graph G8a shows the quantum efficiency of the photoelectric surface 1 having an intermediate film 4 formed of LiF. The graph G8b shows the quantum efficiency of the photoelectric surface 1 having an intermediate film 4 formed of $CaF_2$. The graph G8c shows the quantum efficiency of the photoelectric surface 1 having an intermediate film 4 formed of $MgF_2$. As shown in FIG. 8, it was found that the graph G8c showed the highest quantim efficiency in a band of 200 nm or more and 350 nm or less. Accordingly, it was found that it was most preferable that the intermediate film 4 was formed of $MgF_2$ out of the fluorides.

Figure 9:
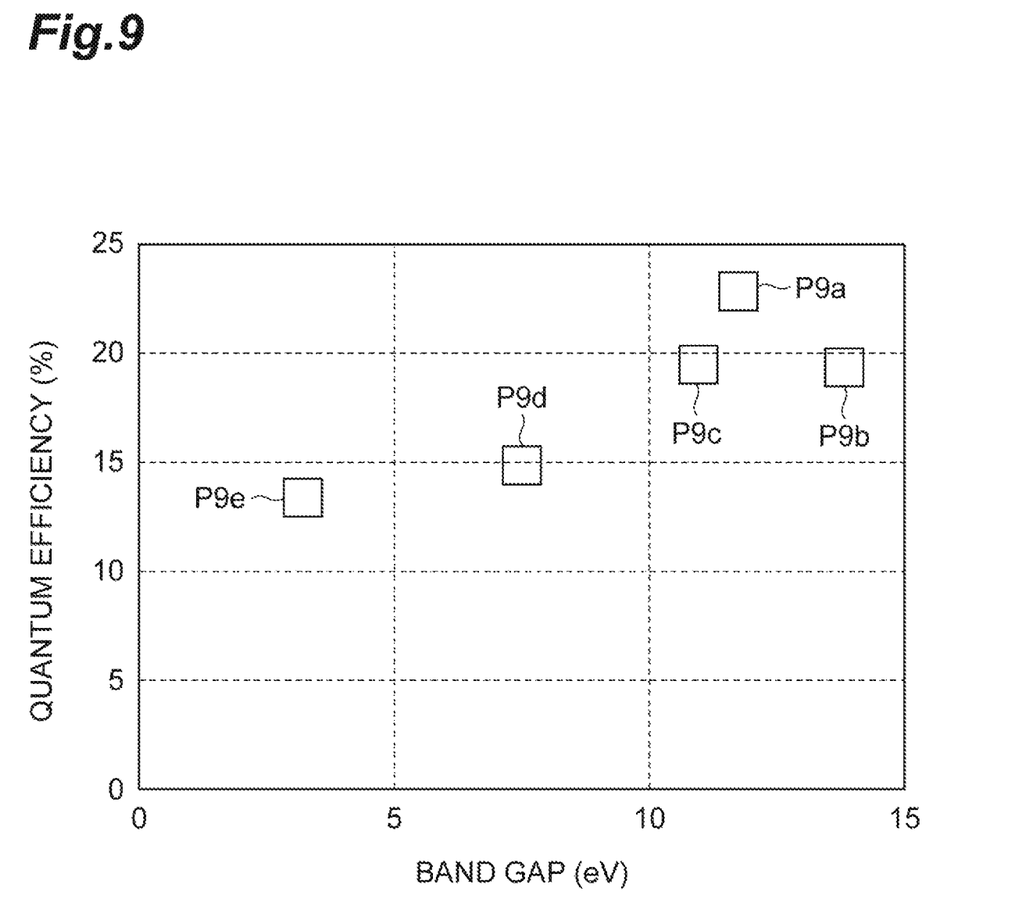
FIG. 9 is a graph showing a relationship between a band gap and quantum efficiency.

Incidentally, the intermediate film 4 has a region having a high band gap formed near the photoelectric conversion film 6. Then, it is thought that as the band gap of the intermediate film 4 increases, the quantum efficiency of the photoelectric surface 1 increases. In Comparative Examples 1 and 2, the band gap of each material used as the materials for the intermediate film 4, and the band gap of $MgF_2$ used as the material for the intermediate film 4 are as follows. In addition, FIG. 9 shows a relationship between the band gap and the quantum efficiency. The quantum efficiency in FIG. 9 is a value in the case of a detection wavelength of 280 nm. The following plots P9a, P9b, P9c, P9d, and P9e correspond to the plots P9a, P9b, P9c, P9d, and P9e in FIG. 9.

$MgF_2$ (plot P9a): 11.4 eV
LiF (plot P9b): 13.8 eV
$CaF_2$ (plot P9c): 11.0 eV
$Al_2O_3$ (plot P9d): 7.5 eV
$TiO_2$ (plot P9e): 3.2 eV With reference to FIG. 9, it was found that a positive correlation was established between the band gap and the quantum efficiency. On the other hand, it was found that when attention was paid to $MgF_2$ (plot P9a) and LiF (plot P9b), $MgF_2$ having a small band gap exhibited a higher quantum efficiency than LiF. The reason is presumed that factors other than the band gap of the intermediate film are involved in the quantum efficiency. Examples thereof include the effect of the intermediate film on the crystallinity of the photoelectric conversion film. It is presumed that the relation of band gap, crystallinity, or the like comprehensively works between the intermediate film and the photoelectric conversion film to determine the quantum efficiency.

The present invention is not limited to the above-described embodiments and various modification can be made within a range not departing from the gist of the present invention.

For example, as the material for forming the window material 2, calcium fluoride (CaF) and magnesium fluoride (MgF$_2$) may be used. In addition, as the material for forming the conductive film 3, carbon-based materials such as graphene and carbon nanotube (CNT) may be used. Further, the conductive film 3 may have a stripe structure or a mesh structure in consideration of light transmission. In addition, as the alkali metal included in the photoelectric conversion film 6, sodium (Ni), potassium (K), and rubidium (Rb) may be used.

Further, in the above-describe embodiment, the photoelectric surface is provided in the image intensifier, but the photoelectric surface may be used for optic devices other than the image intensifier. For example, the photoelectric surface may be used for a photoelectric conversion tube or a photomultiplier tube. In this case, the photoelectric surface 1 shown in the above-described embodiment is provided in a vacuum container, and a dynode which becomes a multiplier which multiplies electrons or a microchannel plate is provided behind the photoelectric surface 1. Behind the dynode or microchannel plate, a positive electrode (anode) is provided in a state in which the positive electrode is accommodated in the vacuum container. To the positive electrode, a predetermined bias voltage is applied to the photoelectric surface, the electron multiplier, and the positive electrode through a lead pin. Then, the output signal from the positive electrode is output to the outside through the lead pin.

REFERENCE SIGNS LIST

1 . . . PHOTOELECTRIC SURFACE, 2 . . . WINDOW MATERIAL, 3 . . . CONDUCTIVE FILM, 4 . . . INTERMEDIATE FILM, 6 . . . PHOTOELECTRIC CONVERSION FILM, 11 . . . IMAGE INTENSIFIER, 12 . . . VACUUM CONTAINER, 13 . . . MICROCHANNEL PLATE (ELECTRON MULTIPLIER MEANS), 14 . . . FLUORESCENT SURFACE, 16 . . . EMISSION WINDOW MATERIAL

The invention claimed is:

1. A photoelectric surface having a laminated structure, the photoelectric surface comprising:
   a window material that transmits ultraviolet rays;
   a conductive film that is formed on the window material and has conductivity;
   an intermediate film that is formed on the conductive film and includes a compound of magnesium and fluorine; and
   a photoelectric conversion film that is formed on the intermediate film and includes tellurium and an alkali metal, wherein the photoelectric conversion film receives light that has passed through the window material, the conductive film, and the intermediate film, in order, and generates photoelectrons,
   wherein the intermediate film has a thickness selected from the range of 0.5 nm to 5.0 nm based on a wavelength of the ultraviolet rays and to cause the photoelectrons generated by the photoelectric conversion film to have a quantum efficiency of 20% or more relative to the ultraviolet rays transmitted by the window material.

2. The photoelectric surface according to claim 1, wherein the compound is magnesium fluoride.

3. The photoelectric surface according to claim 1, wherein the alkali metal is cesium.

4. The photoelectric surface according to claim 1, wherein the conductive film includes titanium.

5. The photoelectric surface according to claim 1, wherein the window material includes quartz.

6. A photoelectric conversion tube comprising:
   a vacuum container that includes the photoelectric surface according to claim 1.

7. An image intensifier comprising:
   a vacuum container that includes the photoelectric surface according to claim 1;
   electron multiplier means that is accommodated in the vacuum container and multiplies electrons emitted from the photoelectric conversion film; and
   a fluorescent surface onto which the electrons multiplied by the electron multiplier means are incident and that convert the electrons multiplied by the electron multiplier means into light.

8. A photomultiplier tube comprising:
   a vacuum container that includes the photoelectric surface according to claim 1;
   electron multiplier means that is accommodated in the vacuum container and multiplies electrons emitted from the photoelectric conversion film; and
   an anode that is accommodated in the vacuum container and onto which the electrons multiplied by the electron multiplier means are incident.

* * * * *